United States Patent
Campbell et al.

(10) Patent No.: US 10,396,050 B2
(45) Date of Patent: Aug. 27, 2019

(54) CHIP ALIGNMENT UTILIZING SUPEROMNIPHOBIC SURFACE TREATMENT OF SILICON DIE

(71) Applicant: International Business Machines Corporation, Armonk, NY (US)

(72) Inventors: Eric J. Campbell, Rochester, MN (US); Sarah K. Czaplewski, Rochester, MN (US); Joseph Kuczynski, North Port, FL (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/800,952

(22) Filed: Nov. 1, 2017

(65) Prior Publication Data

US 2018/0082969 A1    Mar. 22, 2018

Related U.S. Application Data

(62) Division of application No. 15/079,868, filed on Mar. 24, 2016, now Pat. No. 9,859,244.

(51) Int. Cl.
*H01L 23/00* (2006.01)
*H01L 21/48* (2006.01)
(Continued)

(52) U.S. Cl.
CPC .......... *H01L 24/08* (2013.01); *H01L 21/4846* (2013.01); *H01L 23/291* (2013.01); *H01L 24/03* (2013.01); *H01L 24/741* (2013.01); *H01L 24/75* (2013.01); *H01L 24/81* (2013.01); *H01L 25/0657* (2013.01); *H01L 24/05* (2013.01); *H01L 24/13* (2013.01); *H01L 25/50* (2013.01); *H01L 2224/0217* (2013.01); *H01L 2224/03829* (2013.01); *H01L 2224/0401* (2013.01); *H01L 2224/056* (2013.01); *H01L 2224/10135* (2013.01); *H01L 2224/10165* (2013.01);
(Continued)

(58) Field of Classification Search
CPC . H01L 24/16; H01L 21/4846; H01L 25/0657; H01L 24/81; H01L 23/91
USPC ........................................................ 257/777
See application file for complete search history.

(56) References Cited

U.S. PATENT DOCUMENTS

| | | | |
|---|---|---|---|
| 5,249,733 A | 10/1993 | Brady et al. |
| 7,696,001 B2 | 4/2010 | Nuechter et al. |
| 8,574,964 B2 | 11/2013 | Cho et al. |
| 2010/0248424 A1 | 9/2010 | Luce et al. |

(Continued)

FOREIGN PATENT DOCUMENTS

| JP | 2009-218280 A | 9/2009 |
|---|---|---|
| JP | 2011223487 A | 11/2011 |

(Continued)

OTHER PUBLICATIONS

List of IBM Patents or Applications Treated as Related.
(Continued)

*Primary Examiner* — Anthony Ho
(74) *Attorney, Agent, or Firm* — Patterson + Sheridan, LLP

(57) ABSTRACT

Certain embodiments of the present disclosure provide a method for soldering a chip onto a surface. The method generally includes forming a bonding pad on the surface on which the chip is to be soldered, wherein the bonding pad is surrounded, at least in part, by dielectric material. The method may also include treating the dielectric material to render the dielectric material superomniphobic, and soldering the chip onto the bonding pad.

8 Claims, 7 Drawing Sheets

(51) Int. Cl.
*H01L 25/065* (2006.01)
*H01L 23/29* (2006.01)
*H01L 25/00* (2006.01)

(52) U.S. Cl.
CPC .......... *H01L 2224/131* (2013.01); *H01L 2224/13023* (2013.01); *H01L 2224/14131* (2013.01); *H01L 2224/16057* (2013.01); *H01L 2224/16145* (2013.01); *H01L 2224/16227* (2013.01); *H01L 2224/1713* (2013.01); *H01L 2224/757* (2013.01); *H01L 2224/7518* (2013.01); *H01L 2224/8112* (2013.01); *H01L 2224/81026* (2013.01); *H01L 2224/81121* (2013.01); *H01L 2224/81143* (2013.01); *H01L 2224/81191* (2013.01); *H01L 2224/81815* (2013.01); *H01L 2225/06513* (2013.01); *H01L 2225/06517* (2013.01); *H01L 2924/05442* (2013.01)

(56) References Cited

U.S. PATENT DOCUMENTS

2014/0011013 A1 1/2014 Jin et al.
2017/0278817 A1 9/2017 Campbell et al.

FOREIGN PATENT DOCUMENTS

| JP | 2012191021 A | 10/2012 |
| JP | 2015103760 A | 6/2015 |
| KR | 19980042762 U | 9/1998 |
| KR | 101055491 B1 | 8/2011 |
| TW | 201108370 A | 3/2011 |
| WO | 2012086871 A1 | 6/2012 |

OTHER PUBLICATIONS

Tuteja et al, "Robust omniphobic surfaces," Proceedings of the National Academy of Sciences of the United States of America, vol. 105, No. 47, Sep. 26, 2008, downloaded from <http://www.pnas.org/tontent/105/47/18200.long>, 14 pages.

CHIP ALIGNMENT UTILIZING SUPEROMNIPHOBIC SURFACE TREATMENT OF SILICON DIE

CROSS-REFERENCE TO RELATED APPLICATIONS

This application is a divisional of co-pending U.S. patent application Ser. No. 15/079,868, filed Mar. 24, 2016, herein incorporated by reference in its entirety.

BACKGROUND

Three-dimensional (3D) integrated circuits have proven to be the favored approach for improving the performance of semiconductor products. Density can be upgraded many fold by stacking chips or wafers. Significant speed improvement can also be expected because the interconnecting wires linking the chips are shortened substantially.

Aligning solder bumps and pads during the manufacturing process of 3D chip stacks is a cumbersome process. Misalignment of solder bumps diminishes the manufacturing yield and the signal integrity of the interconnections. Traditional alignment techniques include mechanical and/or optical alignment methods.

SUMMARY

Certain embodiments of the present disclosure are directed to a method for soldering a chip onto a surface. The method generally includes forming a bonding pad on the surface on which the chip is to be soldered, wherein the bonding pad is surrounded, at least in part, by dielectric material, treating the dielectric material to render the dielectric material superomniphobic, and soldering the chip onto the bonding pad.

Certain embodiments of the present disclosure are directed to an apparatus that includes a bonding pad formed on a surface, wherein the bonding pad is surrounded, at least in part, by dielectric material, and wherein the dielectric material is treated to render the dielectric material superomniphobic, and a chip soldered onto the bonding pad.

Certain embodiments of the present disclosure are directed to an apparatus for soldering a chip onto a surface. The apparatus generally includes a processing system configured to form a bonding pad on the surface on which the chip is to be soldered, wherein the bonding pad is surrounded, at least in part, by dielectric material, treat the dielectric material to render the dielectric material superomniphobic, and solder the chip onto the bonding pad.

DETAILED DESCRIPTION

Generally, embodiments of the present disclosure are directed to a method of aligning solder bumps and pads during the manufacturing process of three-dimensional (3D) chip stacks. The method involves applying a surface treatment to exposed dielectric material of a chip that is to be soldered onto another chip. The treatment renders the material superomniphobic, and the surface therefore repels liquids. When the solder is melted, the liquid solder moves off of the superomniphobic surfaces and onto the pads, ensuring a good interconnection between the solder and the pads.

Superomniphobic surfaces repel liquids due to contact angles between the surface and any liquid that may be disposed on the surface. For example, superomniphobic surfaces may display contact angles of greater than 150 degrees. One approach to fabricating a superomniphobic surface on silicon dioxide ($SiO_2$) (e.g., a dielectric material) is through lithography methods, which are known by persons of ordinary skill in the art. For example, treating the $SiO_2$ to render the $SiO_2$ superomniphobic may include a two-step etching process comprising reactive ion etching of the $SiO_2$ and subsequent isotropic etching of the Si using vapor-phase xenon difluoride ($XeF_2$) process. The result of this process may be under-cut silicon pillars, capped with a layer of $SiO_2$.

Figure 1:
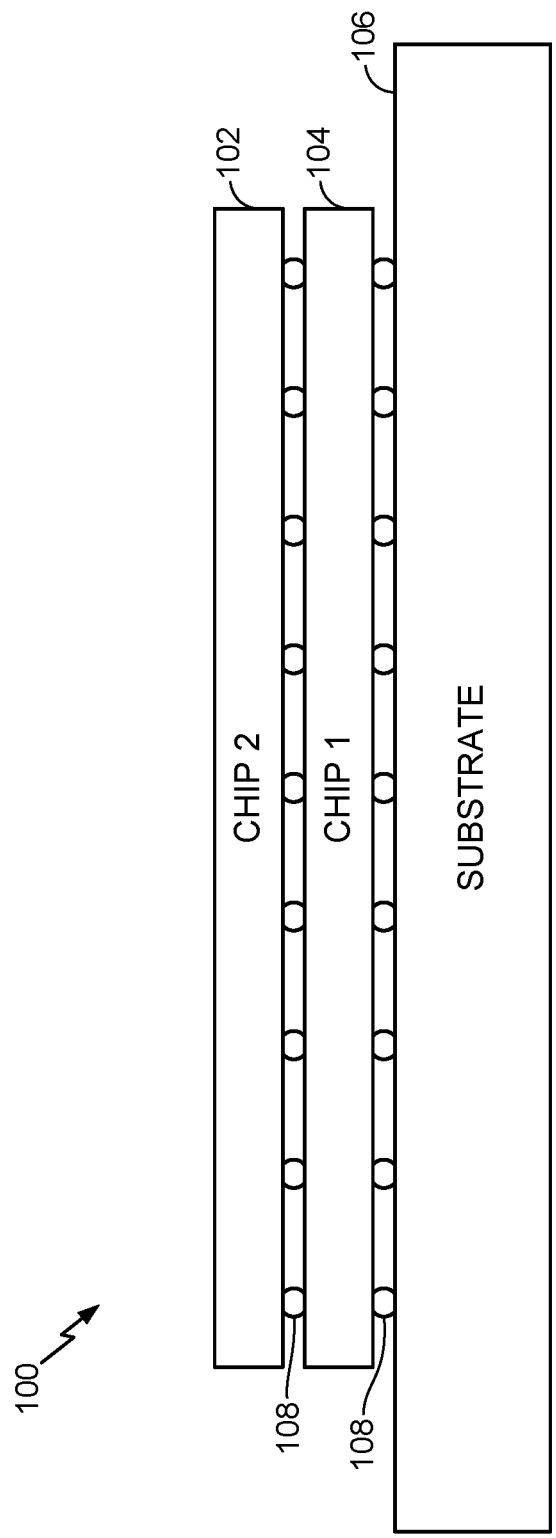
FIG. 1 is a block diagram of an example three-dimensional (3D) chip stack soldered on a substrate.

FIG. 1 illustrates a 3D chip stack 100. The 3D chip stack 100 may include a chip 102 that is stacked on top of another chip 104. The 3D chip stack 100 may be coupled to a substrate 106 via solder 108. 3D packaging allows for space savings by stacking multiple chips into a single package, for example. A typical example may be a processor chip and a memory chip 3D stack, with the cache memory stacked on top of the processor. However, chips that are arranged as a 3D chip stack have to communicate via off-chip signaling. For example, a bottom surface of chip 102 may include multiple bonding pads (e.g., metal pads) that may be soldered to pads formed on a top surface of chip 104. A bottom surface of chip 104 may also include pads which may be soldered to pads formed on a substrate 106. The solder 108 provides an electrical connection for transfer of signals between chip 102, chip 104, and the substrate 106.

For very tight, low-profile chips, a solder ball may be placed on the bonding pad (e.g., of chip 102, chip 104, or the substrate) and then connected directly to another device (e.g., another chip or a substrate). It is important that each of the bonding pads of the chip to be soldered to another device are properly aligned with the corresponding pads of the connecting device. However, to exploit the full potential of high-performance ICs, the number of off-chip electrical connections (e.g. solder balls) is increasing, resulting in smaller and smaller sized bonding pads. Therefore, as chip size decreases, and as the number of bonding pads increases, aligning these devices to obtain a reliable electrical connection becomes more and more difficult.

Figure 2:
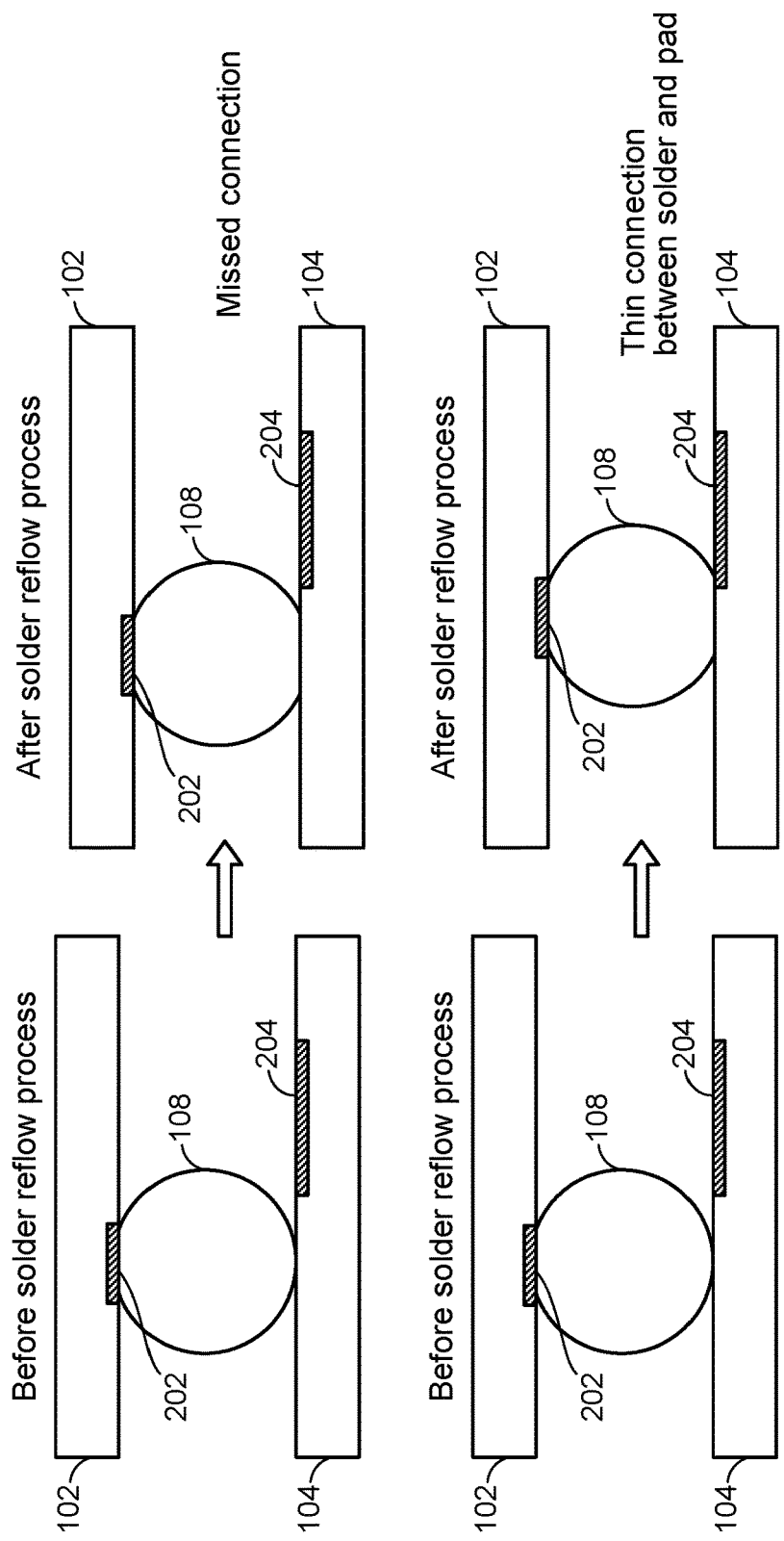
FIG. 2 illustrates a connection between a pad on a bottom surface of a chip and a pad formed on a top surface of another chip before and after a solder reflow process.

FIG. 2 illustrates an electrical connection between a bonding pad 202 formed on the bottom surface of chip 102 and a bonding pad 204 formed on the top surface of chip 104 before and after a solder reflow process. As illustrated, solder 108 may be applied between chip 102 and chip 104. Bonding pad 202 and bonding pad 204 may be mechanically and/or optically aligned. However, due to the small size of bonding pads 202 and 204, the mechanical and/or optical alignment may be imperfect. For example, as illustrated, bonding pad 202 may not be horizontally aligned with bonding pad 204, and thus, while the solder 108 may be in contact with the bonding pad 202, it may not be in contact with bonding pad 204. Therefore, after the solder 108 is reflowed, an electrical connection may not be formed between bonding pads 202 and bonding pad 204. This may result in failed production testing, reducing production yields, or worst, cause errors in products sold to consumers.

In some cases, solder 108 may be in contact with both bonding pad 202 and bonding pad 204, providing an electrical connection, however, the connection may be thin between the solder 108 and the bonding pad 204. The thin electrical connection may have a negative impact on the integrity of signals communicated via bonding pads 202 and 204 by, for example, increasing the resistance between the bonding pads. Again, this thin connection may result in failed production testing, reducing production yields, or worst, cause errors in products sold to consumers.

Figure 3:
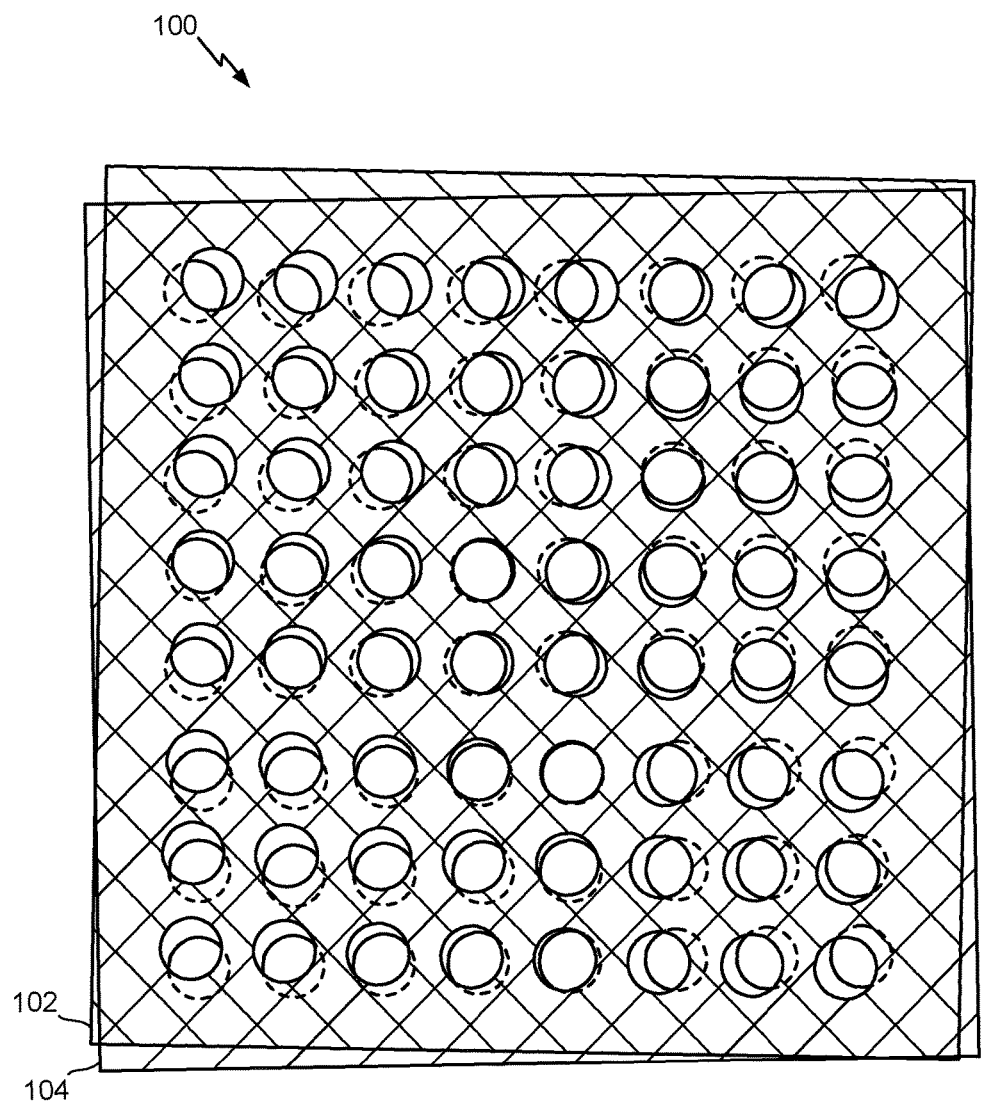
FIG. 3 illustrates a top down view of an example 3D chip stack after a solder reflow process.

FIG. 3 illustrates a top down view of a 3D chip stack 100. As illustrated, improper alignment of bonding pads of chip 102 and 104 may occur after the reflow process, which may impact signal integrity. Therefore, what is needed are techniques for aligning solder bumps and bonding pads during the manufacturing process of a 3D chip stack to protect the integrity of interconnections between bonding pads of the 3D chip stack and increase manufacturing yield.

Figure 4:
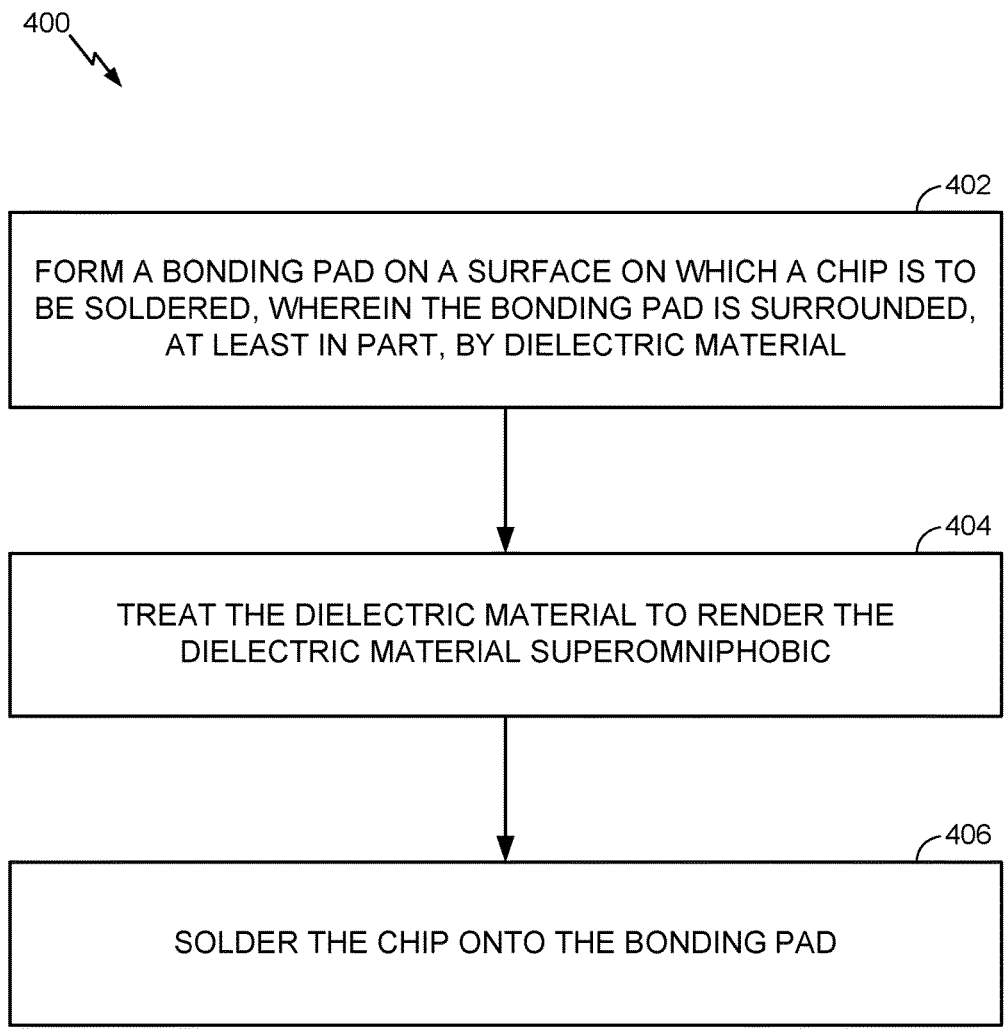
FIG. 4 is a flow diagram of example operations for soldering a chip onto a surface, in accordance with embodiments of the present disclosure.

FIG. 4 is a flow diagram of example operations 400 for soldering a chip onto a surface, in accordance with embodiments of the present disclosure. The operations 400 may be performed, for example, by a computing device.

The operations 400 begin, at block 402, by forming a bonding pad on the surface on which the chip is to be soldered. The bonding pad may be surrounded, at least in part, by dielectric material. In some cases, the dielectric material may be silicon dioxide ($SiO_2$). At block 404, the dielectric material may be treated to render the dielectric material superomniphobic. Treating the dielectric material to render the dielectric material superomniphobic changes the surface energy of the dielectric material such that a difference between the surface energy of the dielectric material and the bonding pad increases.

At block 406, operations 400 may continue by soldering the chip onto the bonding pad formed on the surface. In certain embodiments, the surface on which the chip is be soldered may be the surface of another chip or a substrate. Soldering the chip onto the bonding pad may include applying solder onto the bonding pad, placing the chip on the bonding pad, and reflowing the solder. In certain embodiments, a bonding pad of the chip may be aligned (e.g., optically or mechanically) with the bonding pad on the surface, before placing the chip on the bonding pad. The operations 400 are described in more detail with respect to FIGS. 5-7.

Figure 5:
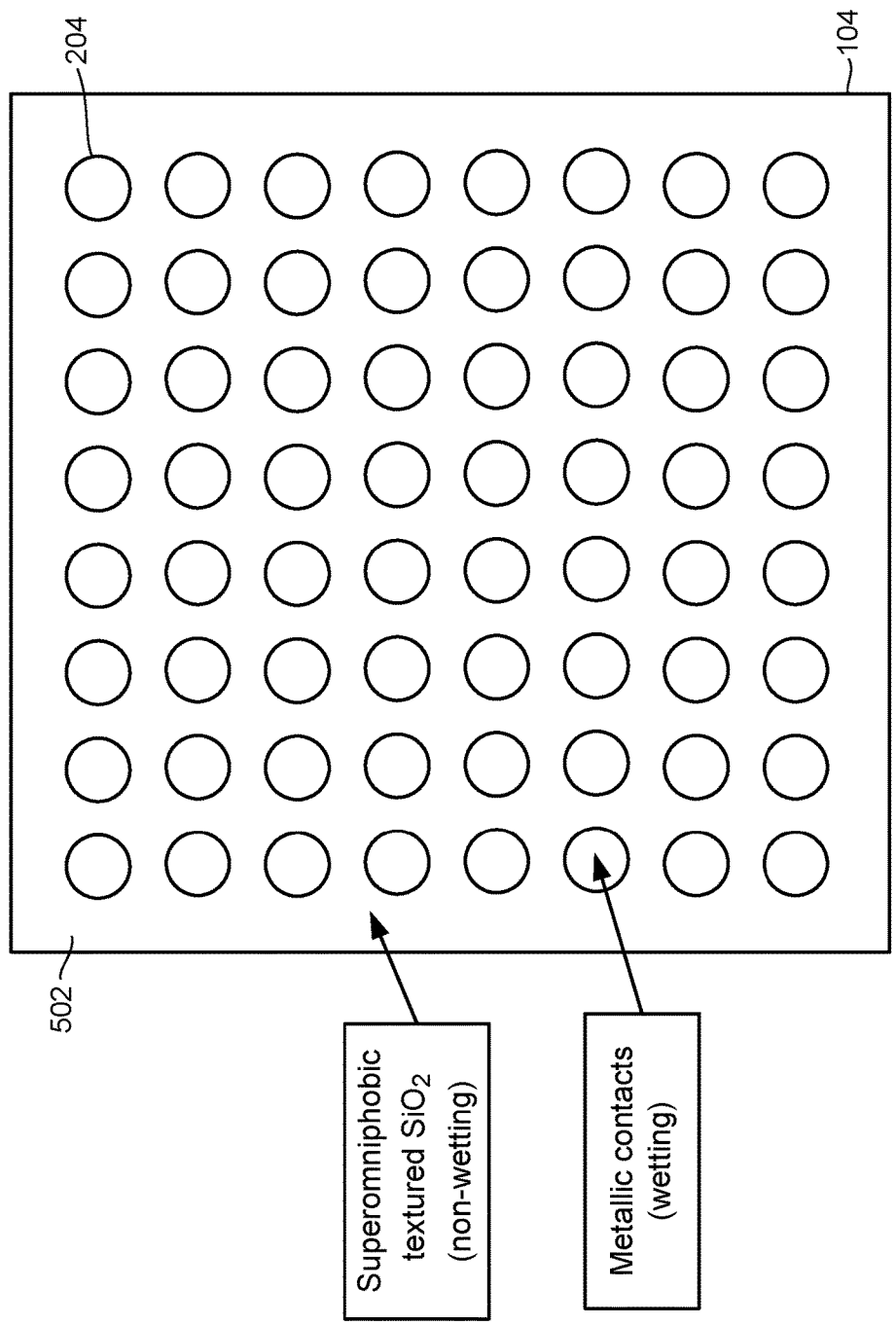
FIG. 5 illustrates a chip having multiple pads for providing connectivity to another chip or a substrate, in accordance with embodiments of the present disclosure.
Figure 6:
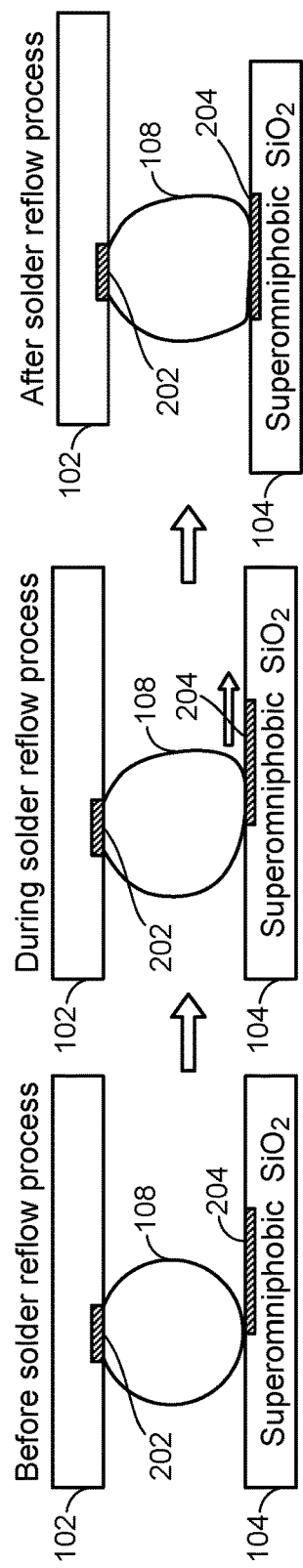
FIG. 6A illustrates a chip having a superomniphobic surface after optical and/or mechanical alignment with another chip, in accordance with certain embodiments of the present disclosure.
FIG. 6B illustrates movement of solder during a solder reflow cycle, in accordance with certain embodiments of the present disclosure.
FIG. 6C illustrates a connection of a chip having a superomniphobic surface after a solder reflow process, in accordance with certain embodiments of the present disclosure.

FIG. 5 illustrates a chip 104 having multiple bonding pads 204 for providing connectivity to another chip or a substrate (e.g., chip 102 or substrate 106), in accordance with embodiments of the present disclosure. As illustrated, the bonding pads 204 may be surrounded by dielectric material (e.g., Silicon Dioxide ($SiO_2$)) 502. The dielectric material may be treated to render the dielectric material superomniphobic. As presented above, superomniphobic surfaces repel liquids and may be referred to as non-wetting surfaces. For example, a surface treatment may be applied to the dielectric material in order to create micro-roughness on the surface to render the dielectric material superomniphobic.

The treatment of the dielectric material may be performed during the back-end-of-the-line (BEOL) processing of the 3D chip stack 100, for example. The BEOL is typically the portion of IC fabrication where the individual devices (transistors, capacitors, resistors, etc.) get interconnected with wiring on the wafer.

FIG. 6A illustrates chip 104 having a superomniphobic surface after optical and/or mechanical alignment with chip 102, in accordance with certain embodiments of the present disclosure. For example, after the dielectric material on the surface of chip 104 is treated to render the dielectric material superomniphobic, the bonding pad 204 may be optically and/or mechanically aligned to bonding pad 202. While alignment of the bonding pads 202 and 204 may be imperfect, the bonding pads 202 and 204 may be aligned to a point where at least a portion of solder 108 is in contact with both bonding pads 202 and 204.

FIG. 6B illustrates movement of solder during a solder reflow cycle, in accordance with certain embodiments of the present disclosure. As illustrated, during the reflow process, the solder 108 begins to liquefy. At this point, the liquid solder may begin to move off of the superomniphobic surface of chip 104 due to the differences in surface energy between the superomniphobic surface of the dielectric material and the bonding pad 204. That is, if any of the liquid solder 108 is in contact with the bonding pad 204, the solder will migrate toward the bonding pad 204 and off of the superomniphobic surface of the dielectric material. This may improve the interconnection between the solder 108 and bonding pad 204. That is, as illustrated in FIG. 6C, after the solder reflow process, the solder 108 may be in full contact with both bonding pads 202 and 204, increasing the integrity of the electrical connection between bonding pads 202 and 204.

In certain embodiments, the dielectric material of chip 102 may be rendered superomniphobic instead of, or in addition to, the dielectric material of chip 104. By rendering the dielectric material of chip 102 superomniphobic, the solder 108 may also migrate toward bonding pad 202, further increasing the alignment and integrity of the electrical connection between bonding pad 202 and bonding pad 204. In certain embodiments, dielectric material on a surface of the substrate 106 may be treated to render the surface of the substrate 106 superomniphobic. In a similar manner as described herein, a chip may then be soldered onto the substrate, increasing alignment of bonding pads on the chip and the substrate.

Figure 7:
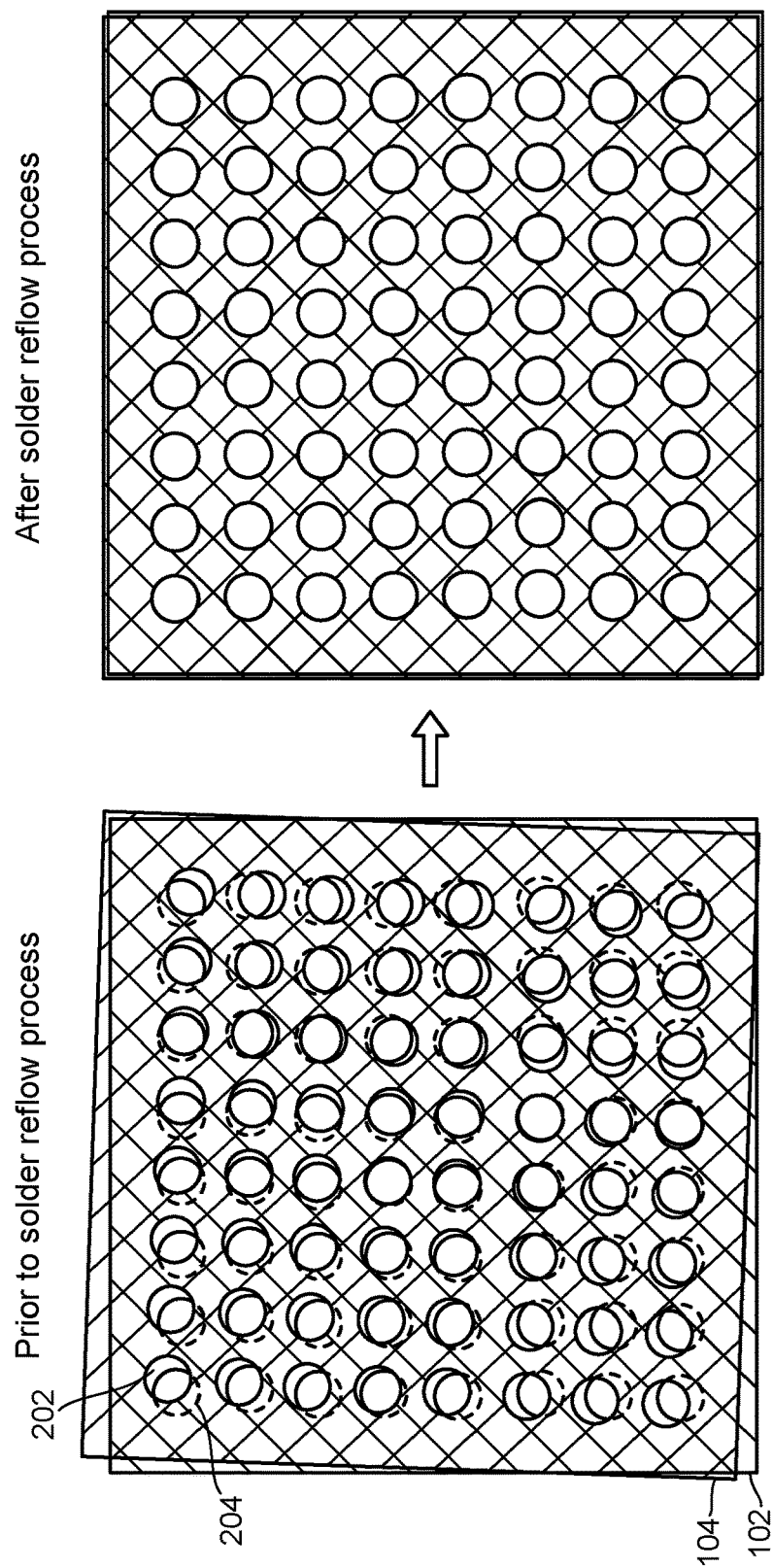
FIG. 7 illustrates a top down view of an example 3D chip stack with a superomniphobic surface after a solder reflow process, in accordance with certain embodiments of the present disclosure.

FIG. 7 illustrates the chip 102 and the chip 104 prior to, and after a solder reflow process, in accordance with certain embodiments of the present disclosure. As illustrated, after placement of chip 102 on top of chip 104, the bonding pads 202 and 204 are misaligned. However, due to the superomniphobic surface of the dielectric material surrounding bonding pads of chip 104 (and/or bonding pads of chip 102), solder disposed on the dielectric material surrounding bonding pads of chip 104 (or bonding pads of chip 102) may migrate towards the bonding pads, increasing alignment of bonding pads of chips 102 and 104.

While embodiments of the present disclosure have been described with respect to a 3D chip stack to facilitate understanding, the embodiments of the present disclosure may also be used to align and couple bonding pads of a chip to bonding pads on a substrate or an interposer. In certain embodiments, dielectric material surrounding bonding pads on a substrate may be rendered superomniphobic and a chip may be soldered onto the substrate.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system."

Embodiments of the present disclosure may be a system, a method, and/or a computer program product. The computer program product may include a computer readable storage medium (or media) having computer readable program instructions thereon for causing a processor to carry out embodiments of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present disclosure.

Embodiments of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. An apparatus, comprising:
    a bonding pad formed on a surface, wherein the bonding pad is surrounded, at least in part, by dielectric material, and wherein the dielectric material is treated to render the dielectric material superomniphobic; and
    a chip soldered onto the bonding pad on the surface, wherein the chip comprises a bonding pad, and wherein the bonding pad on the surface is aligned with the bonding pad of the chip.

2. The apparatus of claim 1, wherein the surface comprises a surface of another chip or a substrate.

3. The apparatus of claim 1, wherein the dielectric material comprises a different surface energy than the bonding pad.

4. The apparatus of claim 1, wherein the dielectric material comprises silicon dioxide.

5. An apparatus for soldering a chip onto a surface, comprising:
    a processing system configured to:
        form a bonding pad on the surface on which the chip is to be soldered, wherein the bonding pad is surrounded, at least in part, by dielectric material;
        treat the dielectric material to render the dielectric material superomniphobic; and
    solder the chip onto the bonding pad, wherein the chip comprises a bonding pad, and wherein the processing system is configured to solder the chip onto the bonding pad on the surface by:
    applying solder onto the bonding pad of the chip;
    placing the chip on the bonding pad on the surface; and
    reflowing the solder to enable surface tension alignment of the bonding pad of the chip with the bonding pad on the surface, wherein the reflowing of the solder results in aligning of the bonding pad of the chip with the bonding pad on the surface after placing the chip on the bonding pad on the surface.

6. The apparatus of claim 5, wherein the dielectric material comprises silicon dioxide.

7. The apparatus of claim 5, wherein the surface on which the chip is to be soldered is the surface of another chip or a substrate.

8. The apparatus of claim 5, wherein treating the dielectric material changes a surface energy of the dielectric material such that a difference between the surface energy of the dielectric material and the bonding pad increases.

* * * * *